(12) United States Patent
Gill

(10) Patent No.: US 7,872,837 B2
(45) Date of Patent: Jan. 18, 2011

(54) METHOD AND APPARATUS FOR PROVIDING A MAGNETIC READ SENSOR HAVING A THIN PINNING LAYER AND IMPROVED MAGNETOREISTIVE COEFFICIENT

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 790 days.

(21) Appl. No.: 11/857,959

(22) Filed: Sep. 19, 2007

(65) Prior Publication Data

US 2008/0032159 A1 Feb. 7, 2008

Related U.S. Application Data

(63) Continuation-in-part of application No. 10/837,280, filed on Apr. 30, 2004, now Pat. No. 7,593,196.

(51) Int. Cl.
*G11B 5/39* (2006.01)
(52) U.S. Cl. .................................. 360/324.11
(58) Field of Classification Search ............. 360/324.11
See application file for complete search history.

(56) References Cited

U.S. PATENT DOCUMENTS

| | | | | |
|---|---|---|---|---|
| 6,108,177 A | 8/2000 | Gill | ........................ | 360/324.12 |
| 6,157,525 A | 12/2000 | Iwasaki et al. | ......... | 360/324.12 |
| 6,210,818 B1 | 4/2001 | Saito | ....................... | 428/811.2 |
| 6,278,589 B1 | 8/2001 | Gill | ............................. | 360/314 |
| 6,313,973 B1 | 11/2001 | Fuke et al. | ............... | 360/324.1 |
| 6,437,950 B1 | 8/2002 | Chau et al. | ............. | 360/324.11 |
| 6,469,877 B1 | 10/2002 | Knapp et al. | ........... | 360/324.12 |
| 6,560,078 B1 | 5/2003 | Pinarbasi | ............... | 360/324.11 |
| 6,636,398 B2 | 10/2003 | Sasaki et al. | ........... | 360/324.12 |
| 6,751,844 B2 | 6/2004 | Pinarbasi | ................. | 29/603.14 |
| 6,819,532 B2 * | 11/2004 | Kamijo | ................... | 360/324.11 |
| 6,977,801 B2 | 12/2005 | Carey et al. | ............ | 360/324.11 |
| 7,593,196 B2 | 9/2009 | Gill | | |
| 2002/0015268 A1 | 2/2002 | Mao et al. | .............. | 360/324.12 |
| 2002/0015269 A1 | 2/2002 | Iwasaki et al. | ......... | 360/324.12 |

(Continued)

FOREIGN PATENT DOCUMENTS

JP          11346017 A     12/1999

(Continued)

OTHER PUBLICATIONS

"Double Dual Giant Magnetoresistance (GMR) Head, Comprises Three Antiferromagnetic Layers to Provide Pinning to Four Antiparallel Pinned Ferromagnetic Layers," Jan. 10, 2000, Derwent-RD, RD 429165 A.

(Continued)

*Primary Examiner*—Mark Blouin
(74) *Attorney, Agent, or Firm*—Merchant & Gould

(57) ABSTRACT

A method and apparatus for providing a magnetic read sensor having a thin pinning layer and improved magnetoresistive coefficient $\Delta R/R$ is disclosed. A thin IrMn alloy pinning layer is disposed adjacent a composite pinned layer, wherein the percentage of iron in the pinned layer adjacent the thin IrMn alloy pinning layer in the range of 20-40% to provide maximum pinning.

20 Claims, 10 Drawing Sheets

U.S. PATENT DOCUMENTS

| | | |
|---|---|---|
| 2002/0064595 A1 | 5/2002 | Nomura et al. ............. 427/131 |
| 2002/0067577 A1* | 6/2002 | Beach et al. ................. 360/314 |
| 2002/0098380 A1 | 7/2002 | Platt .......................... 428/692 |
| 2002/0126423 A1 | 9/2002 | Terunuma et al. ........... 360/319 |
| 2002/0196588 A1* | 12/2002 | Gill ............................ 360/314 |
| 2003/0030945 A1 | 2/2003 | Heinonen et al. ........ 360/324.2 |
| 2003/0053266 A1 | 3/2003 | Dieny et al. ................. 360/324 |
| 2003/0128483 A1* | 7/2003 | Kamijo ................. 360/324.11 |
| 2004/0257721 A1 | 12/2004 | Furukawa et al. ...... 360/324.12 |
| 2005/0047263 A1 | 3/2005 | Drewes et al. .............. 365/232 |
| 2005/0243476 A1 | 11/2005 | Gill ....................... 360/324.11 |
| 2006/0056116 A1* | 3/2006 | Horng et al. ........... 360/324.11 |
| 2009/0244790 A1* | 10/2009 | Ibusuki et al. ............ 360/324.1 |

FOREIGN PATENT DOCUMENTS

| | | |
|---|---|---|
| JP | 2001006132 A | 1/2001 |
| JP | 2003124541 A | 4/2003 |
| WO | WO 9958994 A1 | 11/1999 |

OTHER PUBLICATIONS

Carey et al. "Improved Corrosion Resistance of IrMn Antiferromagnets for Spin Valve Applications by Alloying with Cr and Ru," May 2, 2002, Magnetics Conference 2002; INTERMAG Europe 2002; Digest of Technical Papers. 2002IEEE International. p. CA1.

* cited by examiner

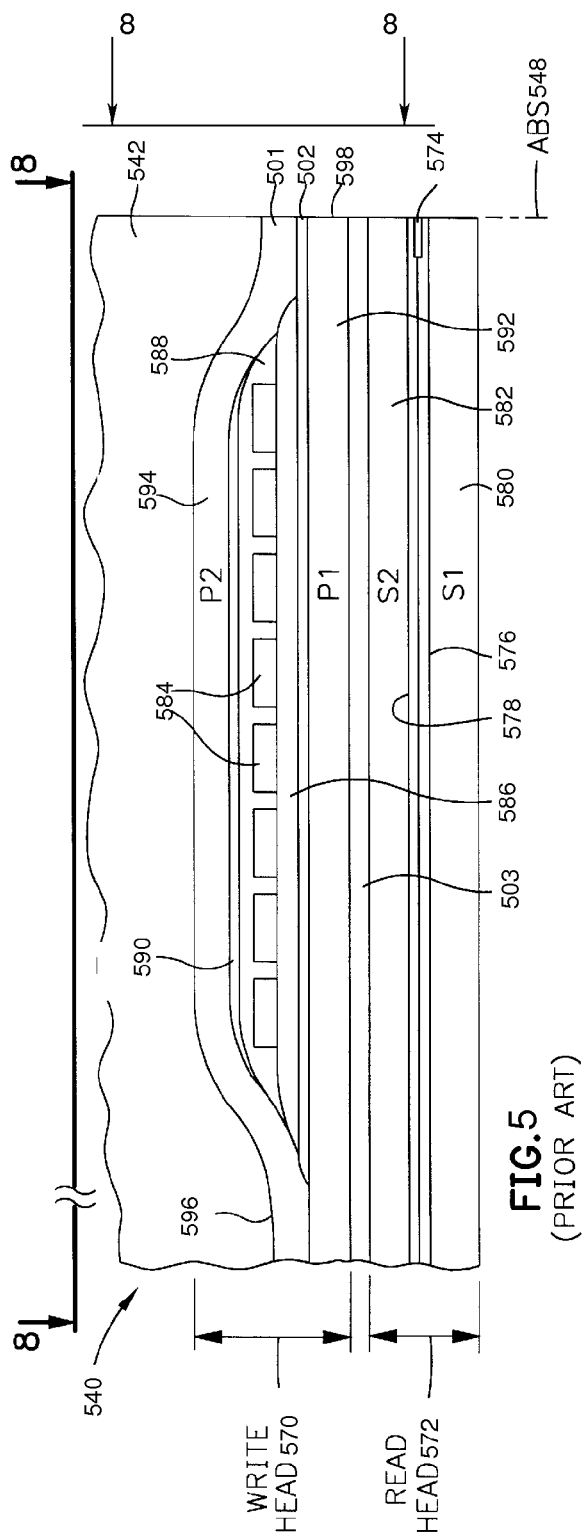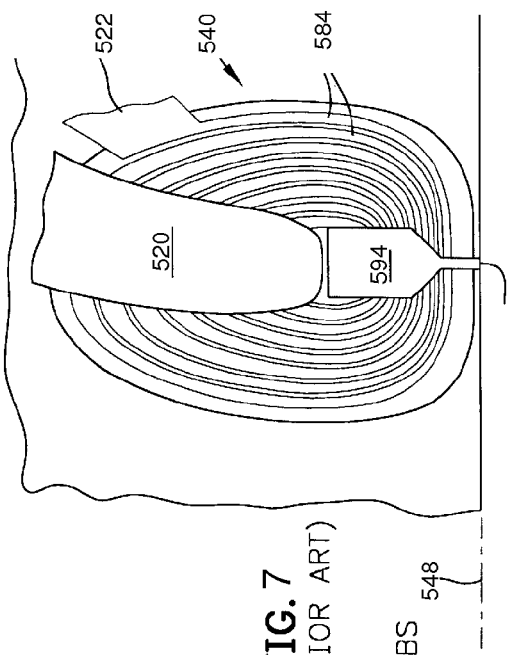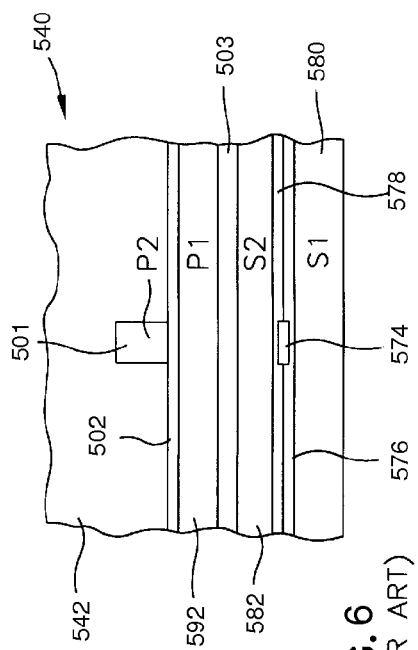
FIG. 5 (PRIOR ART)
FIG. 6 (PRIOR ART)
FIG. 7 (PRIOR ART)

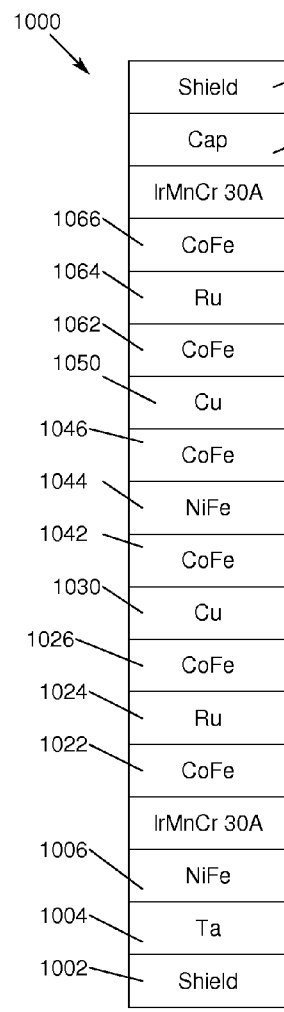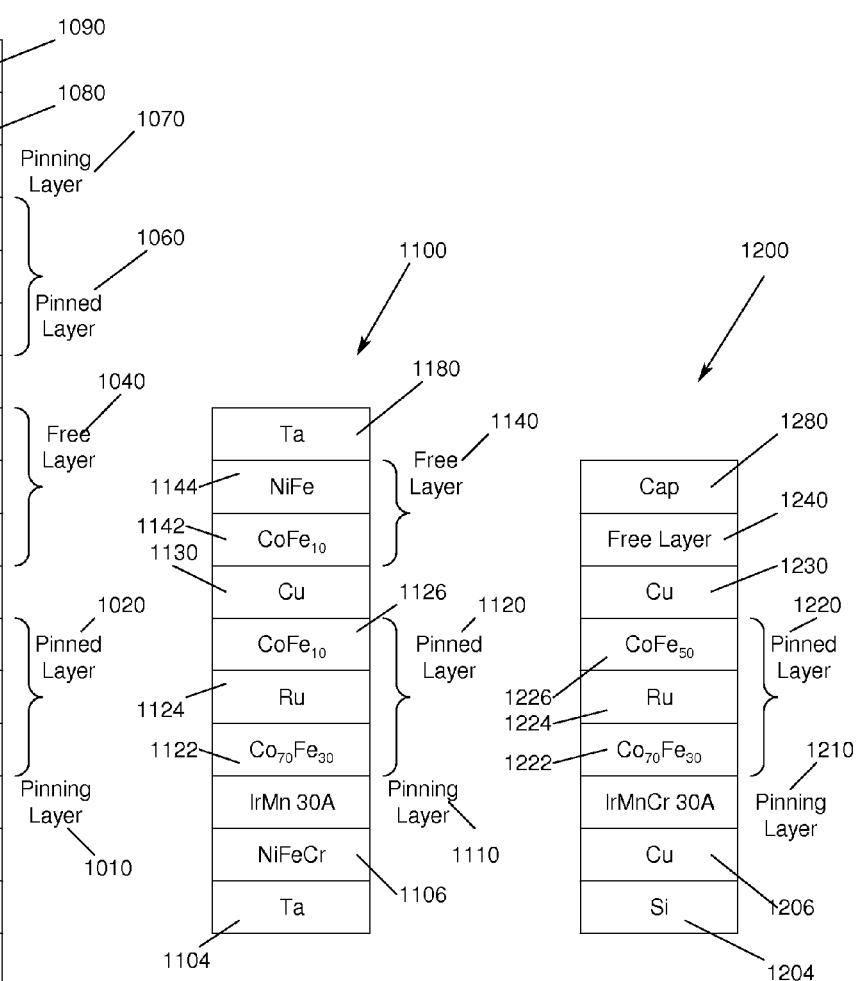
Fig. 10    Fig. 11    Fig. 12

METHOD AND APPARATUS FOR PROVIDING A MAGNETIC READ SENSOR HAVING A THIN PINNING LAYER AND IMPROVED MAGNETOREISTIVE COEFFICIENT

RELATED APPLICATION

This application is a continuation-in-part of U.S. application Ser. No. 10/837,280, filed Apr. 30, 2004, which is hereby incorporated by reference.

BACKGROUND OF THE INVENTION

1. Field of the Invention

This invention relates in general to magnetic read sensors, and more particularly to a method and apparatus for providing a magnetic read sensor having a thin pinning layer and improved magnetoresistive coefficient $\Delta R/R$.

2. Description of Related Art

The heart of a computer is typically a magnetic disk drive which includes a rotating magnetic disk, a slider that has write and read heads, a suspension arm above the rotating disk and an actuator arm. The suspension arm biases the slider into contact with a parking ramp or the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the actuator arm swings the suspension arm to place the write and read heads over selected circular tracks on the rotating disk where field signals are written and read by the write and read heads. The write and read heads are connected to processing circuitry that operates according to a computer program to implement the writing and reading functions.

Conventional magnetoresistive (MR) sensors, such as those used in magnetic recording disk drives, operate on the basis of the anisotropic magnetoresistive (AMR) effect in which a component of the read element resistance varies as the square of the cosine of the angle between the magnetization in the read element and the direction of sense current flow through the read element. Recorded data can be read from a magnetic medium because the external magnetic field from the recorded magnetic medium (the signal field) causes a change in the direction of magnetization in the read element, which in turn causes a change in resistance in the read element and a corresponding change in the sensed current or voltage.

A different and more pronounced magnetoresistance, called giant magnetoresistance (GMR), has been observed in a variety of magnetic multilayered structures, the essential feature being at least two ferromagnetic metal layers separated by a non-ferromagnetic metal layer. The physical origin of the GMR effect is that the application of an external magnetic field causes a variation in the relative orientation of neighboring ferromagnetic layers. This in turn causes a change in the spin-dependent scattering of conduction electrons and thus the electrical resistance of the structure. The resistance of the structure thus changes as the relative alignment of the magnetizations of the ferromagnetic layers changes.

A particularly useful application of GMR is a sandwich structure, called a spin valve, comprising two uncoupled ferromagnetic layers separated by a nonmagnetic metal layer in which the magnetization of one of the ferromagnetic layers is pinned. The pinning may be achieved by depositing the layer onto an antiferromagnetic layer, which exchange-couples to the pinned layer. The unpinned layer or free ferromagnetic layer is free to rotate in the presence of any small external magnetic field.

Spin valve structures have been identified in which the resistance between two uncoupled ferromagnetic layers is observed to vary as cosine of the angle between the magnetizations of the two layers and is independent of the direction of current flow. The spin valve produces a magnetoresistance that, for selected combinations of materials, is greater in magnitude than AMR. In general, the larger $\Delta R/R$ is the better the spin valve's performance.

Spin valve (GMR) read heads require two main improvements for future high density recording needs, which are larger signal for detecting ever smaller magnetic bits and smaller read gaps requiring thinner pinning layers. Most previously described spin valve use antiferromagnetic or pinning layer deposited adjacent to the pinned layer for exchange coupling to fix or pin the magnetization of the pinned layer. Through exchange anisotropy with the antiferromagnetic layer, the magnetization of the pinned layer is held rigid against small field excitations, such as those that occur from the signal field to be sensed.

In the presence of some magnetic fields the magnetic moment of the pinned layer can be rotated antiparallel to the pinned direction. The question then is whether the magnetic moment of the pinned layer will return to the pinned direction when the magnetic field is relaxed. This depends upon the strength of the exchange coupling field and the coercivity of the pinned layer. If the coercivity of the pinned layer exceeds the exchange coupling field between the pinning and pinned layers the exchange coupling field will not be strong enough to bring the magnetic moment of the pinned layer back to the original pinned direction. Until the magnetic spins of the pinning layer are reset, the read head is rendered inoperative. Accordingly, there is a strong felt need to increase the exchange coupling field between the pinning layer and the pinned layer so that the spin valve sensor has improved thermal stability.

Another parameter that indicates the performance of the pinning of the pinned layer is the pinning field $H_p$ between the pinning and pinned layers. The pinning field, which is somewhat dependent upon the exchange coupling field $H_{ex}$, is the applied field at which the magnetic moment of the pinned layer commences to rotate in a substantial manner. If the pinning field $H_p$ is low, the orientation of the pinned layer will not be controlled thereby degrading performance of the read head. Accordingly, it is desirable to maximize the pinning field $H_p$.

The thickest layer in a spin valve sensor is typically the pinning layer. An exceptionally thin pinning layer, which is capable of pinning the pinned layer, is iridium manganese (IrMn). While this pinning layer is highly desirable from the standpoint of reducing the read gap between the first and second shield layers, the magnetoresistive coefficient $\Delta R/R$ of the sensor has been relatively low when the iridium manganese (IrMn) pinning layer is formed. It should be noted that when the magnetoresistive coefficient $\Delta R/R$ is increased that the linear bit density is still further increased because the read head has an improved read signal and can read more bits per linear inch along the track.

It can be seen then that there is a need for a method and apparatus for providing a magnetic read sensor having a thin pinning layer and improved magnetoresistive coefficient $\Delta R/R$.

SUMMARY OF THE INVENTION

To overcome the limitations described above, and to overcome other limitations that will become apparent upon reading and understanding the present specification, the present invention discloses a method and apparatus for providing a magnetic read sensor having a thin pinning layer and improved magnetoresistive coefficient $\Delta R/R$.

The present invention solves the above-described problems by providing a thin IrMn alloy pinning layer adjacent a composite pinned layer, wherein the percentage of iron in the pinned layer adjacent the thin IrMn alloy pinning layer in the range of 20-40% to provide maximum pinning.

A magnetic read head in accordance with the principles of the present invention includes a ferromagnetic pinned layer structure comprising at least two pinned layers, the ferromagnetic pinned structure having a high positive magnetostriction, a iridium manganese (IrMn) alloy pinning layer, exchange coupled to the pinned layer structure, for pinning the magnetic moment of the pinned layer structure, a free layer structure having a first magnetization that is free to rotate and a spacer layer disposed between the free layer structure and the ferromagnetic pinned layer structure, wherein the at least two pinned layers of the ferromagnetic pinned layer structure provide maximum exchange coupling between the pinned layer structure and the iridium manganese alloy pinning layer and wherein thickness of at least two of the pinned layers are equal.

In another embodiment of the present invention, a magnetic storage device is provided. The magnetic storage device includes a magnetic media for storing data thereon, a motor, coupled to the magnetic media, for translating the magnetic media, a transducer for reading and writing data on the magnetic media and an actuator, coupled to the transducer, for moving the transducer relative to the magnetic media, wherein the transducer includes a read sensor having a ferromagnetic pinned layer structure comprising at least two pinned layers, the ferromagnetic pinned structure having a high positive magnetostriction, a iridium manganese (IrMn) alloy pinning layer, exchange coupled to the pinned layer structure, for pinning the magnetic moment of the pinned layer structure, a free layer structure having a first magnetization that is free to rotate and a spacer layer disposed between the free layer structure and the ferromagnetic pinned layer structure, wherein the at least two pinned layers of the ferromagnetic pinned layer structure provide maximum exchange coupling between the pinned layer structure and the iridium manganese alloy pinning layer and wherein thickness of at least two of the pinned layers are equal.

In another embodiment of the present invention, a method for providing a magnetic read sensor having a thin pinning layer and improved magnetoresistive coefficient is provided. The method includes forming a ferromagnetic pinned layer structure comprising at least two pinned layers, the ferromagnetic pinned structure having a high positive magnetostriction, forming a iridium manganese (IrMn) alloy pinning layer, exchange coupled to the pinned layer structure, for pinning the magnetic moment of the pinned layer structure, forming a free layer structure having a first magnetization that is free to rotate and forming a spacer layer disposed between the free layer structure and the ferromagnetic pinned layer structure, wherein the at least two pinned layers of the ferromagnetic pinned layer structure provide maximum exchange coupling between the pinned layer structure and the iridium manganese alloy pinning layer and wherein thickness of at least two of the pinned layers are equal.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 5 is a side cross-sectional elevation view of a magnetic head;

FIG. 6 is an air bearing surface (ABS) view of the magnetic head of FIG. 5;

FIG. 7 illustrates the connect leads coupled to the coil for the write pole piece;

FIG. 10 illustrates a dual spin valve magnetoresistive structure having thin pinning layers and improved magnetoresistive coefficient $\Delta R/R$ according to an embodiment of the present invention;

FIG. 11 illustrates a single magnetoresistive structure having a thin pinning layer and improved magnetoresistive coefficient $\Delta R/R$ according to an embodiment of the present invention;

FIG. 12 illustrates another single magnetoresistive structure having a thin pinning layer and improved magnetoresistive coefficient $\Delta R/R$ according to an embodiment of the present invention;

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method and apparatus for providing a magnetic read sensor having a thin pinning layer and improved magnetoresistive coefficient ΔR/R.

The present invention provides a thin IrMn alloy pinning layer adjacent a composite pinned layer, wherein the percentage of iron in the pinned layer adjacent the thin IrMn alloy pinning layer in the range of 20-40% to provide maximum pinning. It also may be desirable for the thicknesses of the outer ferromagnetic layers to be comparable.

Figure 1:
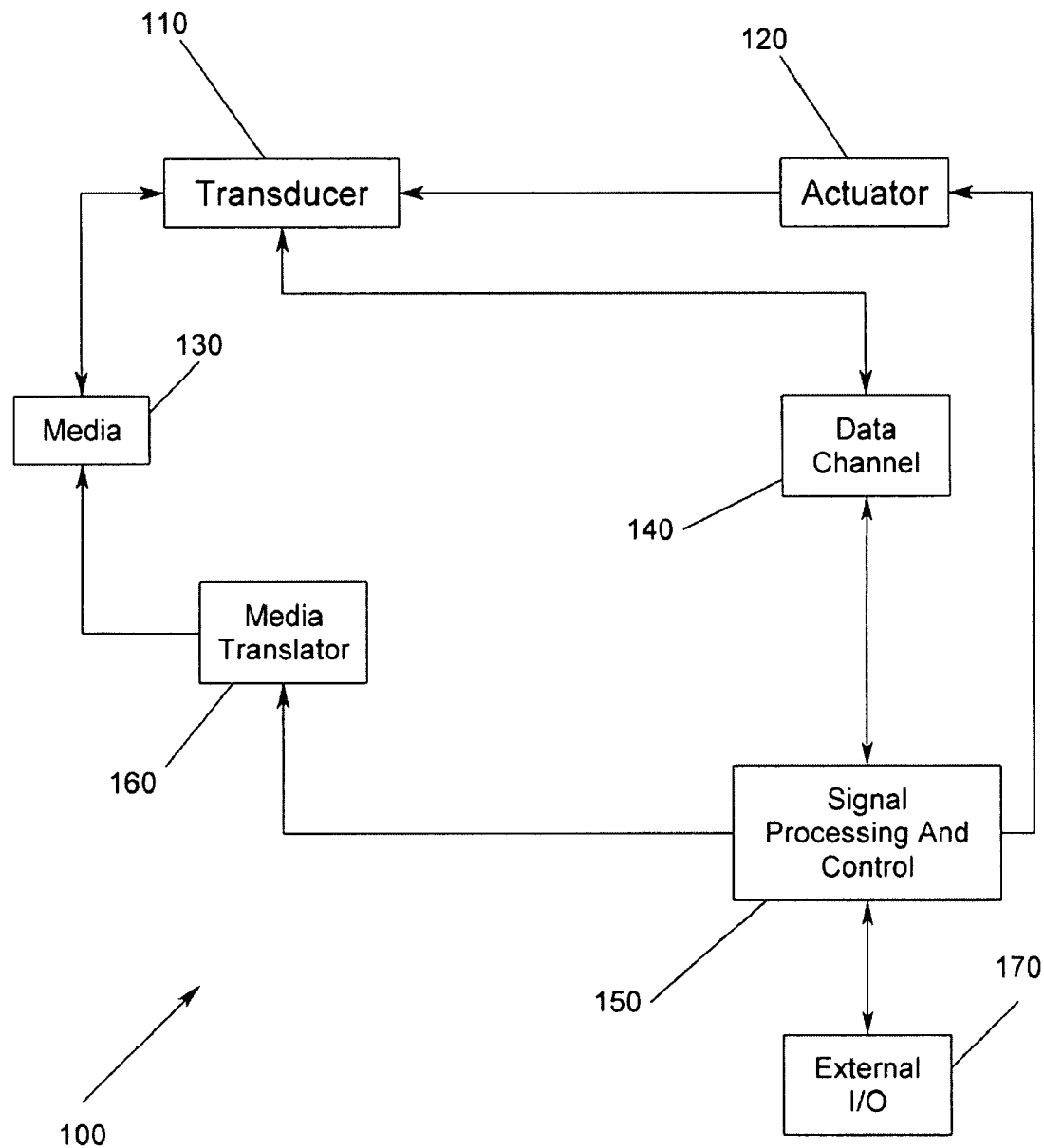
FIG. 1 illustrates a storage system according to an embodiment of the present invention.

FIG. 1 illustrates an exemplary storage system 100 according to the present invention. A transducer 110 is under control of an actuator 120, whereby the actuator 120 controls the position of the transducer 110. The transducer 110 writes and reads data on magnetic media 130. The read/write signals are passed to a data channel 140. A signal processor 150 controls the actuator 120 and processes the signals of the data channel 140 for data exchange with external Input/Output (I/O) 170. I/O 170 may provide, for example, data and control conduits for a desktop computing application, which utilizes storage system 100. In addition, a media translator 160 is controlled by the signal processor 150 to cause the magnetic media 130 to move relative to the transducer 110. The present invention is not meant to be limited to a particular type of storage system 100 or to the type of media 130 used in the storage system 100.

Figure 2:
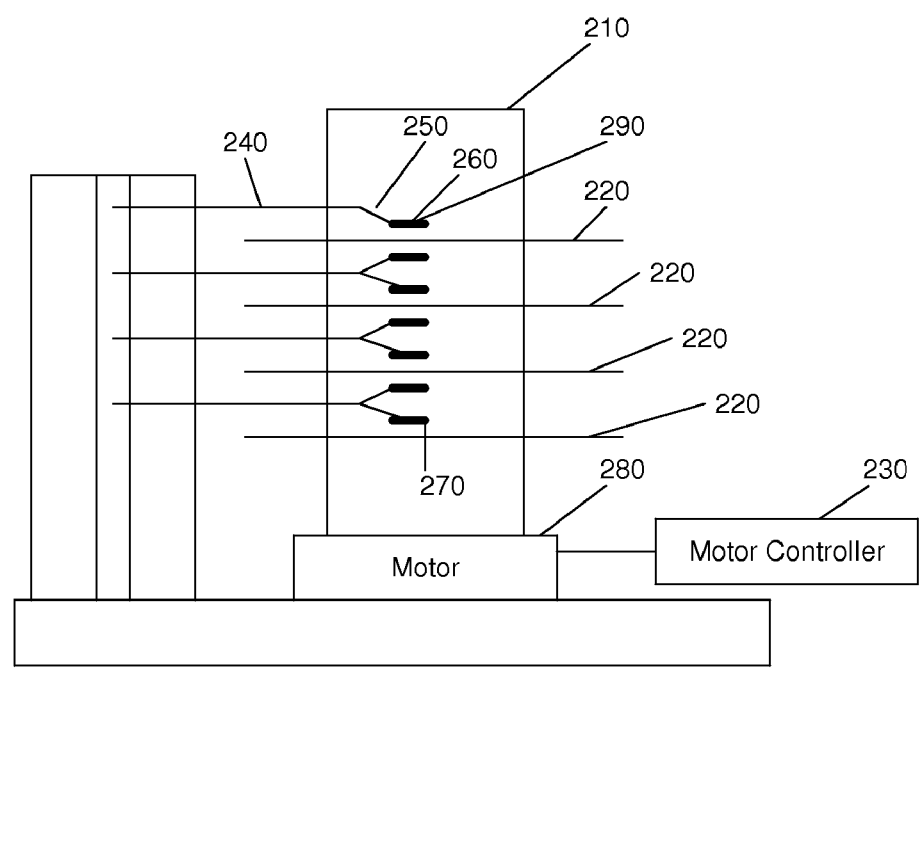
FIG. 2 illustrates one storage system according to an embodiment of the present invention.

FIG. 2 illustrates one particular embodiment of a multiple magnetic disk storage system 200 according to the present invention. In FIG. 2, a hard disk drive storage system 200 is shown. The system 200 includes a spindle 210 that supports and rotates multiple magnetic disks 220. The spindle 210 is rotated by motor 280 that is controlled by motor controller 230. A combined read and write magnetic head 270 is mounted on slider 240 that is supported by suspension 250 and actuator arm 240. Processing circuitry exchanges signals that represent information with read/write magnetic head 270, provides motor drive signals for rotating the magnetic disks 220, and provides control signals for moving the slider 260 to various tracks. Although a multiple magnetic disk storage system is illustrated, a single magnetic disk storage system is equally viable in accordance with the present invention.

The suspension 250 and actuator arm 240 position the slider 260 so that read/write magnetic head 270 is in a transducing relationship with a surface of magnetic disk 220. When the magnetic disk 220 is rotated by motor 280, the slider 240 is supported on a thin cushion of air (air bearing) between the surface of disk 220 and the ABS 290. Read/write magnetic head 270 may then be employed for writing information to multiple circular tracks on the surface of magnetic disk 220, as well as for reading information therefrom.

Figure 3:
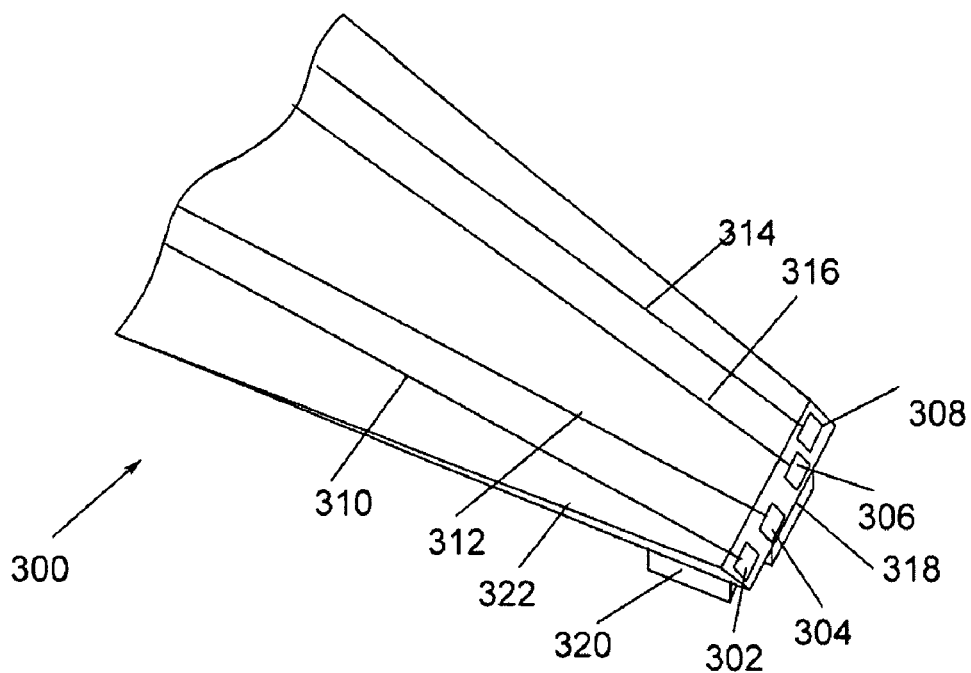
FIG. 3 illustrates a slider mounted on a suspension according to an embodiment of the present invention.

FIG. 3 illustrates a sensor assembly 300. In FIG. 3, a slider 320 is mounted on a suspension 322. First and second solder connections 302 and 308 connect leads from the sensor 318 to leads 310 and 314, respectively, on suspension 322 and third and fourth solder connections 304 and 306 connect to the write coil (not shown) to leads 312 and 316, respectively, on suspension 322.

Figure 4:
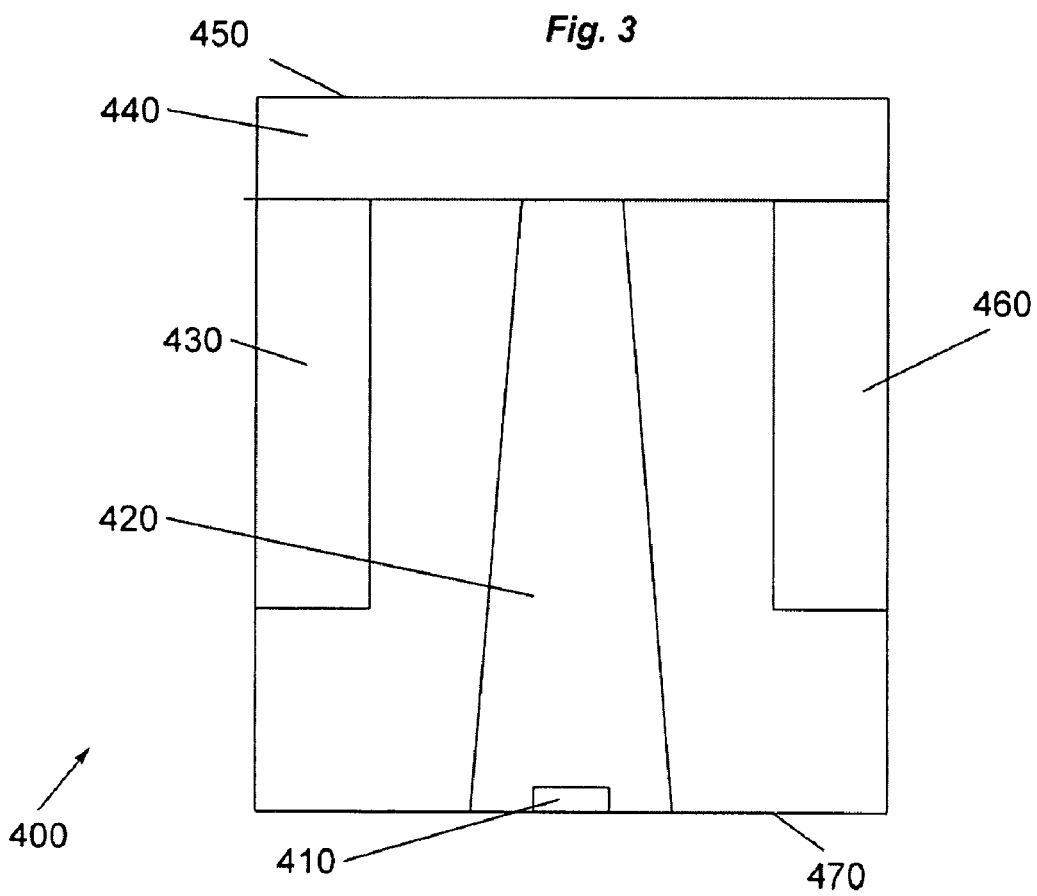
FIG. 4 illustrates an ABS view of the slider and the magnetic head according to an embodiment of the present invention.

FIG. 4 is an ABS view of slider 400 and magnetic head 410. The slider has a center rail 420 that supports the magnetic head 410, and side rails 430 and 460. The support rails 420, 430 and 460 extend from a cross rail 440. With respect to rotation of a magnetic disk, the cross rail 440 is at a leading edge 450 of slider 400 and the magnetic head 410 is at a trailing edge 470 of slider 400.

The above description of a typical magnetic recording disk drive system, shown in the accompanying FIGS. 1-4, is for presentation purposes only. Storage systems may contain a large number of recording media and actuators, and each actuator may support a number of sliders. In addition, instead of an air-bearing slider, the head carrier may be one that maintains the head in contact or near contact with the disk, such as in liquid bearing and other contact and near-contact recording disk drives.

FIG. 5 is a side cross-sectional elevation view of a magnetic head 540. The magnetic head 540 includes a write head portion 570 and a read head portion 572. The read head portion 572 includes a sensor 574. FIG. 6 is an ABS view of the magnetic head of FIG. 5. The sensor 574 is sandwiched between first and second gap layers 576 and 578, and the gap layers are sandwiched between first and second shield layers 580 and 582. In a piggyback head as shown in FIG. 5, the second shield layer (S2) 582 and the first pole piece (P1) 592 are separate layers. The first and second shield layers 580 and 582 protect the MR sensor element 574 from adjacent magnetic fields. More conventionally, the second shield 582 also functions as the first pole (P1) 592 of the write element, giving rise to the term "merged MR head." However, the present invention is not meant to be limited to a particular type of MR head.

In response to external magnetic fields, the resistance of the sensor 574 changes. A sense current is conducted through the sensor causes these resistance changes to be manifested as voltage changes. These voltage changes are then processed as readback signals by the signal processing system 350 shown in FIG. 3.

The write head portion of the magnetic head includes a coil layer 584 sandwiched between first and second insulation layers 586 and 588. A third insulation layer 590 may be employed for planarizing the head to eliminate ripples in the second insulation layer caused by the coil layer 584. The first, second and third insulation layers are referred to in the art as an "insulation stack." The coil layer 584 and the first, second and third insulation layers 586, 588 and 590 are sandwiched between first and second pole piece layers 592 and 594. The first and second pole piece layers 592 and 594 are magnetically coupled at a back gap 596 and have first and second pole tips 598 and 501 which are separated by a write gap layer 502 at the ABS. The first pole piece layer 592 is separated from the second shield layer 582 by an insulation layer 503.

FIG. 7 illustrates a view of the connect leads 520, 522 coupled to the coil 584 for the write pole piece 594. As shown in FIGS. 4-7, first and second solder connections 404 and 406 connect leads from the sensor 574 to leads 412 and 414 on the suspension 444, and third and fourth solder connections 416 and 418 connect leads 520 and 522 from the coil 584 (see FIG. 7) to leads 424 and 426 on the suspension.

Figure 8:
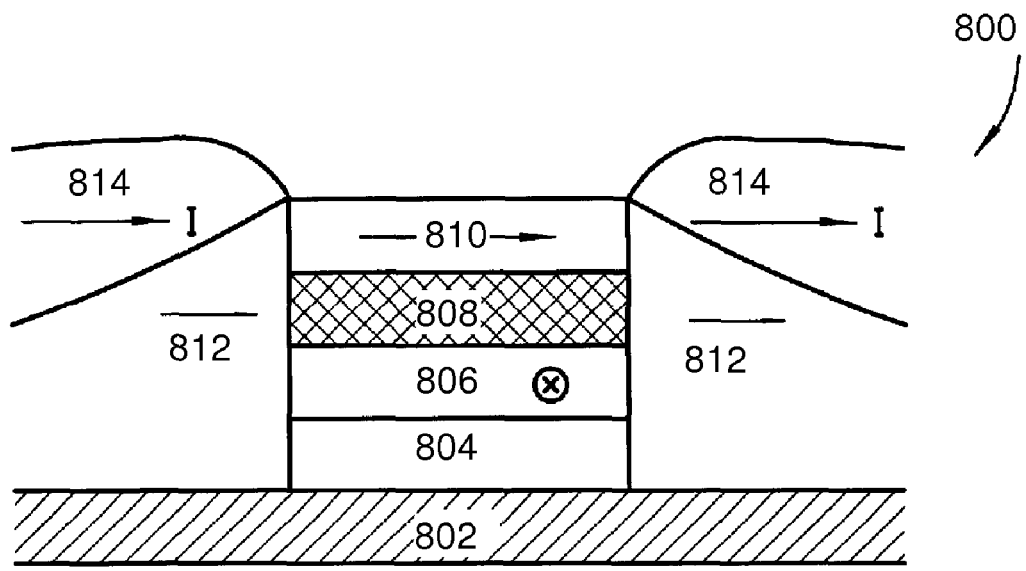
FIG. 8 illustrates the basic components of a typical current-in-plane (CIP) GMR sensor according to one embodiment of the present invention.

FIG. 8 illustrates the basic components of a typical current-in-plane (CIP) GMR sensor 800 according to one embodiment of the present invention. The sensor 800 includes a ferromagnetic reference layer 806 with a fixed transverse magnetic moment (pointing into the page) and a ferromagnetic free layer 810 with a rotatable magnetization vector, which can rotate about the longitudinal direction in response to transverse magnetic signal fields. The direction of the magnetic moment of the reference layer 806 is typically fixed by exchange coupling with an antiferromagnetic layer 804. Exchange-pinned reference layer 806 and free layer 810 are separated by a thin electrically conductive nonmagnetic layer 808. Hard bias layers 812 provide a longitudinal biasing magnetic field to stabilize the magnetization of the free layer 810 approximately in a longitudinal orientation in the absence of other external magnetic fields. Sensor 800 further includes top electrical leads 814 in proximity with hard bias layers 812, and a layer 802 adjacent to the antiferromagnetic layer 804, which represents a combination of the substrate, undercoat, and seed layers. For a shielded sensor, layer 802 may additionally include the bottom shield and insulation layers (for CIP sensors) or electrical contact layers (for CPP sensors).

Figure 9:
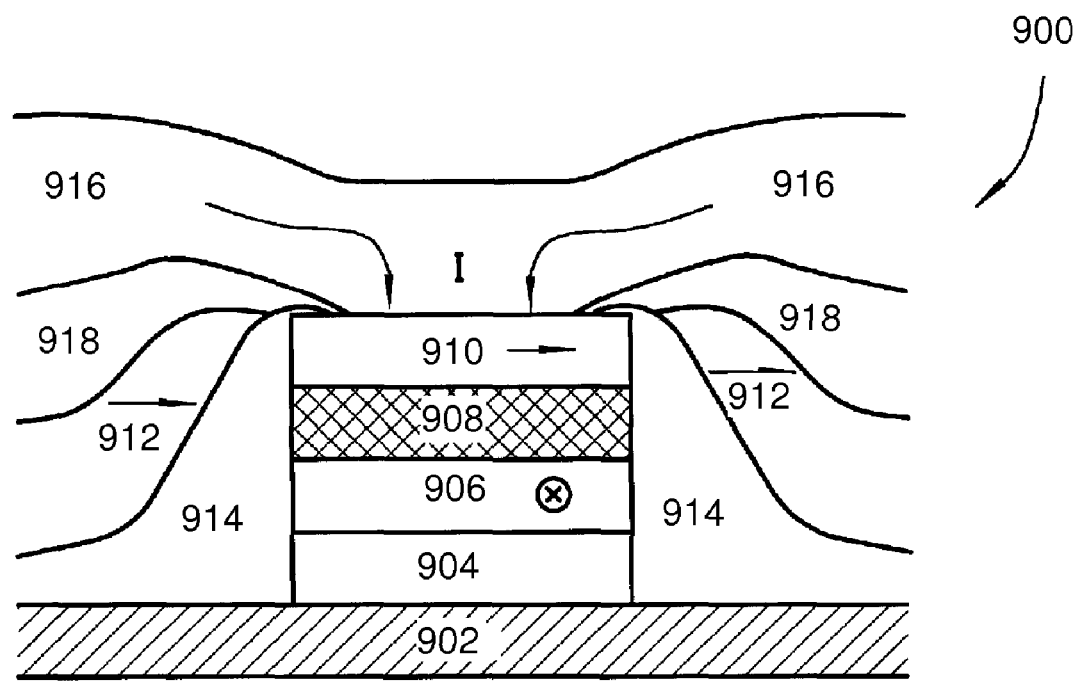
FIG. 9 shows a current-perpendicular-to-plane (CPP) sensor according to one embodiment of the present invention.

FIG. 9 shows a current-perpendicular-to-plane (CPP) sensor 900 according to one embodiment of the present invention. CPP sensor 900 includes a ferromagnetic reference layer 906 with a fixed magnetic moment oriented transversely (into the page) and a ferromagnetic free layer 910 with a rotatable magnetization vector, which can rotate about the longitudinal direction in response to transverse magnetic signal fields. The direction of the magnetic moment of the reference layer 906 is typically fixed by exchange coupling with an antiferromagnetic layer 904. The exchange-pinned reference layer 906 and free layer 910 are spaced apart by a non-magnetic layer 908. For MTJ devices, layer 908 includes an electrically insulating tunnel barrier layer. For CPP-GMR devices, layer 908 is electrically conductive, and is analogous to layer 808 of the CIP-GMR sensor of FIG. 8. Hard bias layers 912 are electrically insulated from the sensor stack and the top electrical lead 916 by insulating layers 914 and 918 respectively. Hard bias layers 912 provide a longitudinal biasing magnetic field to stabilize the magnetization of the free layer 910. Sensor 900 further includes a layer 902, which is similar to layer 802 of sensor 800, in proximity with the antiferromagnetic layer 904.

The above description of a CPP and CIP magnetic sensor, shown in the accompanying FIGS. 8-9, is for presentation purposes only. Those skilled in the art will recognize that other embodiments that provide CPP and CIP sensors are possible, including dual sensor structures, self-pinned structures, etc.

FIG. 10 illustrates a dual spin valve magnetoresistive structure 1000 having thin pinning layers and improved magnetoresistive coefficient $\Delta R/R$ according to an embodiment of the present invention. In FIG. 10, a seed layer of Ta 1004 and NiFe 1006 are deposited on a first shield 1002. Alternatively, a NiFeCr layer may be used to provide a non-magnetic material for forming the first thin pinning layer on. A first thin pinning layer of iridium manganese chromium (IrMnCr) 1010 is formed over the NiFe layer 1006. A first pinned layer 1020 is formed over the first IrMnCr pinning layer 1010. The first pinned layer 1020 includes a first CoFe layer 1022, an interlayer 1024, such as ruthenium, and a second CoFe layer 1026. A first spacer 1030, e.g., copper, is formed over the first pinned layer 1020. A free layer 1040 is formed over the first spacer 1030. The free layer 1040 includes a third CoFe layer 1042, a NiFe layer 1034 and a fourth CoFe layer 1046. A second spacer 1050, e.g., copper, is formed over the free layer 1040. A second pinned layer 1060 is formed over the second spacer 1050. The second pinned layer 1060 includes a fifth CoFe layer 1062, an interlayer 1064, such as ruthenium, and a sixth CoFe layer 1066. A second thin pinning layer of iridium manganese chromium (IrMnCr) 1070 is formed over the second pinned layer 1060. A cap 1080 is formed over the second thin pinning layer 1070. A second shield 1090 is formed over the cap 1080.

In FIG. 10, the layers 1022, 1066 of the pinned layers 1020, 1060 adjacent the pinning layers 1010, 1070 respectively may be cobalt iron (CoFe), which has a high magnetostriction so that after lapping the head the pinned layers 1020, 1060 have a stress-induced anisotropy perpendicular to the ABS which supports the exchange coupling between the pinning layers 1010, 1070 and the first layers 1022, 1066 of the pinned layers 1020, 1060. Also, the antiferromagnetic exchange coupling is inversely proportional to the net pinning moment. Thus, the first 1022 and second 1026 CoFe layers and the fifth 1062 and sixth 1066 CoFe layers should have approximately the same thickness to provide a low net pinning moment, which increases exchange coupling between the first ferromagnetic films 1022, 1066 of the pinned layers 1020, 1060 and the pinning layers 1010, 1070. Moreover, the CoFe layers 1022, 10066 next to the pinning layers 1010, 1070 may include a percentage of iron that provides maximum exchange coupling. The high exchange coupling promotes higher thermal stability of the head. Also, the addition of chromium makes the pinning layers 1010, 1070 more corrosion resistant therefore resulting in improved reliability of the GMR signal.

To provide higher magnetostriction and exchange coupling, the thickness of the IrMnCr layers 1010, 1070 should be in the range of 30-90 Å. Under pinning, as the magnetostriction anisotropy field, $H_k$, becomes small, unidirectional bias from the pinning layers 1010, 1070 prevents the amplitude from flipping.

FIG. 11 illustrates a single magnetoresistive structure 1100 having a thin pinning layer and improved magnetoresistive coefficient $\Delta R/R$ according to another embodiment of the present invention. In FIG. 10, a seed layer of Ta 1104 and NiFeCr 1106 is formed. The NiFeCr 1106 provides a nonmagnetic material for forming the thin pinning layer 1110 on. The thin pinning layer of iridium manganese (IrMn) 1110 is formed over the NiFeCr layer 1106. A first pinned layer 1120 is formed over the IrMn pinning layer 1110. The first pinned layer 1120 includes a $Co_{70}Fe_{30}$ layer 1122, an interlayer 1124, such as ruthenium, and a $CoFe_{10}$ layer 1126. A spacer 1130, e.g., copper, is formed over the pinned layer 1120. A free layer 1140 is formed over the spacer 1130. The free layer 1140 includes a second $CoFe_{10}$ layer 1142 and a NiFe layer 1144. A cap 1180 is formed over the free layer 1140. The cap 1180 may be a tantalum layer.

In FIG. 11, the percentage of iron in the first cobalt iron layer 1122 of the pinned layer 1120 should be in the range of 20-40% to provide maximum pinning, wherein 30% iron is preferred and shown. An IrMn pinning layer 1110 of 30 Å provides sufficient exchange coupling with $Co_{70}Fe_{30}$ 1122 layer. However, those skilled in the art will recognize that an IrMnCr pinning layer may be used and is generally preferred for the pinning layer. The large anisotropy field, $H_k$, of the IrMn pinning layer 1110 will provide pinning while exchange coupling from the IrMn 1120 will prevent the amplitude from flipping.

FIG. 12 illustrates another single magnetoresistive structure 1200 having a thin pinning layer and improved magnetoresistive coefficient $\Delta R/R$ according to another embodiment of the present invention. In FIG. 12, a seed layer of silicon 1204 and copper 1206 is formed. A thin pinning layer of iridium manganese chromium (IrMnCr) 1210 is formed over the copper seed layer 1206. A pinned layer 1220 is formed over the IrMnCr pinning layer 1210. The pinned layer 1220 includes a layer of $Co_{70}Fe_{30}$ 1222, an interlayer 1224, such as ruthenium, and a $CoFe_{50}$ layer 1226. A spacer 1230, e.g., copper, is formed over the pinned layer 1220. A free layer 1240 is formed over the spacer 1230. A cap 1280 is formed over the free layer 1240.

The copper seed layer 1206 allows current shunting, but the structure shown is acceptable for CPP sensors. Also, the percentage of iron in the second cobalt iron layer 1226 of the pinned layer 1220 is increased to approximately 50%. Improved self-pinning is provided using the thin layer of IrMnCr AFM 1210, which provides a restoring field to the sensor as the sensor magnetic orientation flips due to a decrease in the anisotropy pinning, $H_k$, due to external stress. The first pinned layer of $Co_{70}Fe_{30}$ 1222 provides enhanced exchange coupling as well as stronger anisotropy field, $H_k$.

While FIGS. 10-12 show both IrMn and IrMnCr used for the pinning layer, IrMnCr is preferred. Moreover, those skilled in the art will recognize that the structures providing the effects described above with reference to FIGS. 10-12 may be interchange. For example, the sensor 1200 shown in FIG. 12 may be configured with the layer of tantalum 1104 and NiFeCr 1106 shown in FIG. 11; the first pinned layer of $Co_{70}Fe_{30}$ 1122 shown in FIG. 11 may be used in place of the first CoFe layer 1022 and/or the sixth CoFe layer 1066 of FIG. 10; etc. Other modifications may be made without departing from the scope of the present invention.

Figure 13:
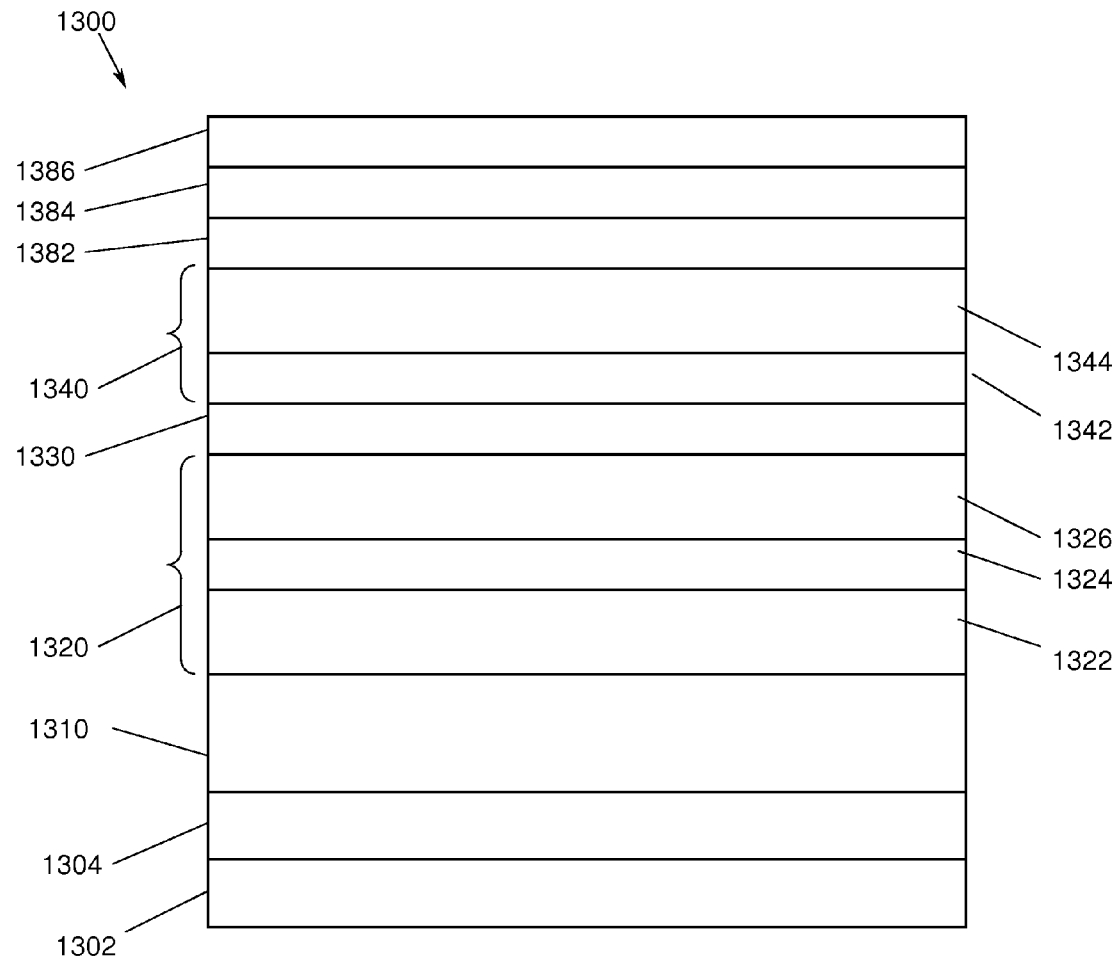
FIG. 13 illustrates a Tunnel MR sensor that uses IrMnCr as the antiferromagnetic material to provide a zero net moment pinned layer and a thin Ru layer according to another embodiment of the present invention.

FIG. 13 illustrates a Tunnel MR sensor 1300 that uses IrMnCr as the antiferromagnetic material to provide a zero net moment pinned layer and a thin Ru layer according to another embodiment of the present invention. In FIG. 13, a thin pinning layer of iridium manganese chromium (IrMnCr) 1310 is formed over a tantalum layer 1302 and ruthenium layer 1304. A pinned layer 1320 is formed over the IrMnCr pinning layer 1310. The pinned layer 1320 includes a layer of $Co_{75}Fe_{25}$ 1322, an interlayer 1324, such as ruthenium, and a CoFeB layer 1326. A tunnel barrier 1330 of magnesium oxide (MgO) is formed over the CoFeB layer 1326. A free layer 1340 is formed over the tunnel barrier layer 1330. The free layer 1330 includes a thin layer of CoFe 1342 and a top layer of CoFeB 1344. Layers of ruthenium 1382, tantalum 1384 and ruthenium 1386 are formed to provide a cap layer 1380 over the free layer 1340.

Tunnel MR (TMR) sensors 1300 have a magnetic free layer 1340 and a magnetic pinned layer 1320 similar to a GMR or spin valve. The tunnel valve 1300, however, has a thin electrically insulating barrier layer 1330 sandwiched between the free 1340 and pinned 1320 layers rather than an electrically conductive spacer layer. A large TMR coefficient is achieved using magnesium oxide (MgO) as the tunnel barrier 1330. The CoFeB layer 1326 provides an amorphous layer for forming the MgO tunnel barrier 1330 to provide the high GMR coefficient by allowing the insulating MgO layer to be a highly oriented crystalline structure.

To pin the orientation of the ferromagnetic pinned layer 1320, the pinned layer 1320 is exposed to a high magnetic field. However, manufacturing of a tunnel junction MR sensor is typically difficult because of the need to apply the high magnetic fields to pin the pinned layers 1320. According to the embodiment of the present invention illustrated in FIG. 13, the ruthenium interlayer 1324 is made thin, e.g., around 3.5 to 4.5 Å, to achieve stronger pinning between the pinned layers 1322, 1326. This increases manufacturing yield because the pinned layers 1322, 1326 are strongly pinned and, as a result do not disorient during fabrication processes or during use in the hard disk drive.

Figure 14:
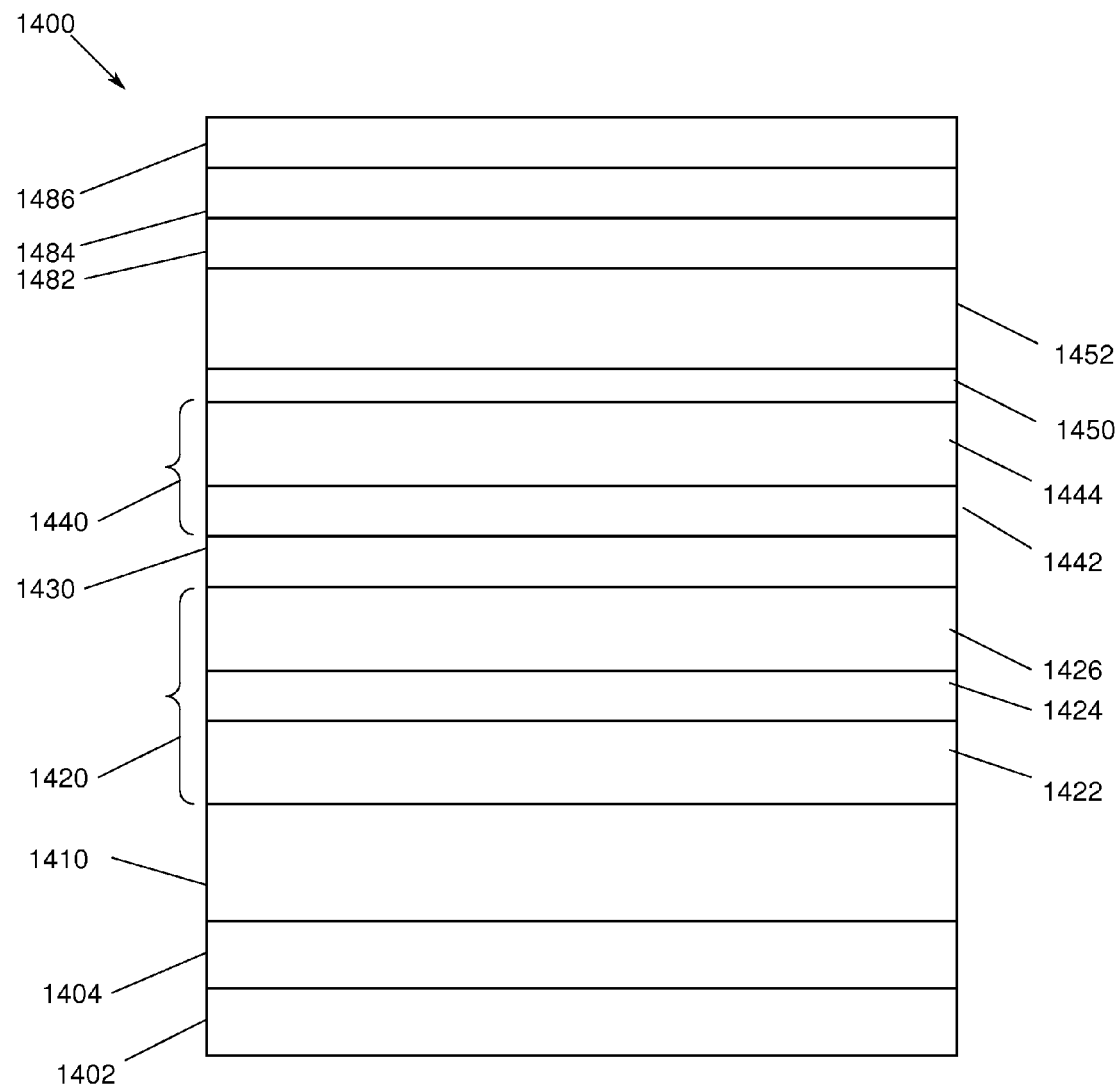
FIG. 14 illustrates a second Tunnel MR sensor that includes a soft magnetic layer for improving the magnetic properties of the free layer according to another embodiment of the present invention.

FIG. 14 illustrates a second Tunnel MR sensor 1400 that includes a soft magnetic layer for improving the magnetic properties of the free layer according to another embodiment of the present invention. Again, a thin pinning layer of iridium manganese chromium (IrMnCr) 1410 is used as the antiferromagnetic material to provide a zero net moment pinned layer. A pinned layer 1420 is formed over the IrMnCr pinning layer 1410. The pinned layer 1420 includes a layer of $Co_{75}Fe_{25}$ 1422, an interlayer 1424, such as ruthenium, and a CoFeB layer 1426. A tunnel barrier 1430 of magnesium oxide (MgO) is formed over the CoFeB layer 1426. A free layer 1440 is formed over the tunnel barrier layer 1430. The free layer 1430 includes a thin layer of CoFe 1442 and a top layer of CoFeB 1444. A tantalum layer 1450 is formed over the layer of CoFeB 1444. A NiFe layer 1452 is formed on the tantalum layer 1450. Layers of ruthenium 1482, tantalum 1484 and ruthenium 1486 are formed to provide a cap layer 1480.

The NiFe layer 1452 provides improved magnetic properties to the free layer 1440 since the NiFe layer 1452 is soft magnetically thereby increasing the sensitivity of the sensor. High sensitivity means a relatively large percentage change in electrical resistance per unit applied magnetic field. However, forming the NiFe layer directly on the CoFeB layer or the CoFe layer results in a decrease in the TMR coefficient. The TMR coefficient of the TMR sensor is expressed as $\Delta R_T/R_{//}$, where $R_{//}$ is a resistance measured when the magnetizations of the sense and reference layers are parallel to each other, and $\Delta R_T$ is the difference in resistance between when the reference/free layer moments are parallel and when these are antiparallel.

A higher TMR coefficient leads to higher signal sensitivity. Thus, a decrease in the TMR coefficient is undesirable. To prevent a decrease in the TMR coefficient, the tantalum layer 1450 is formed before forming the NiFe layer 1452. The tantalum layer 1450 oxidizes easily thereby effectively providing an amorphous layer for forming the NiFe layer 1452 on. Accordingly, the addition of the tantalum layer 1450 and the NiFe layer 1452 as shown in FIG. 14 improves the magnetic properties of the free layer 1440 without decreasing the TMR coefficient.

Figure 15:
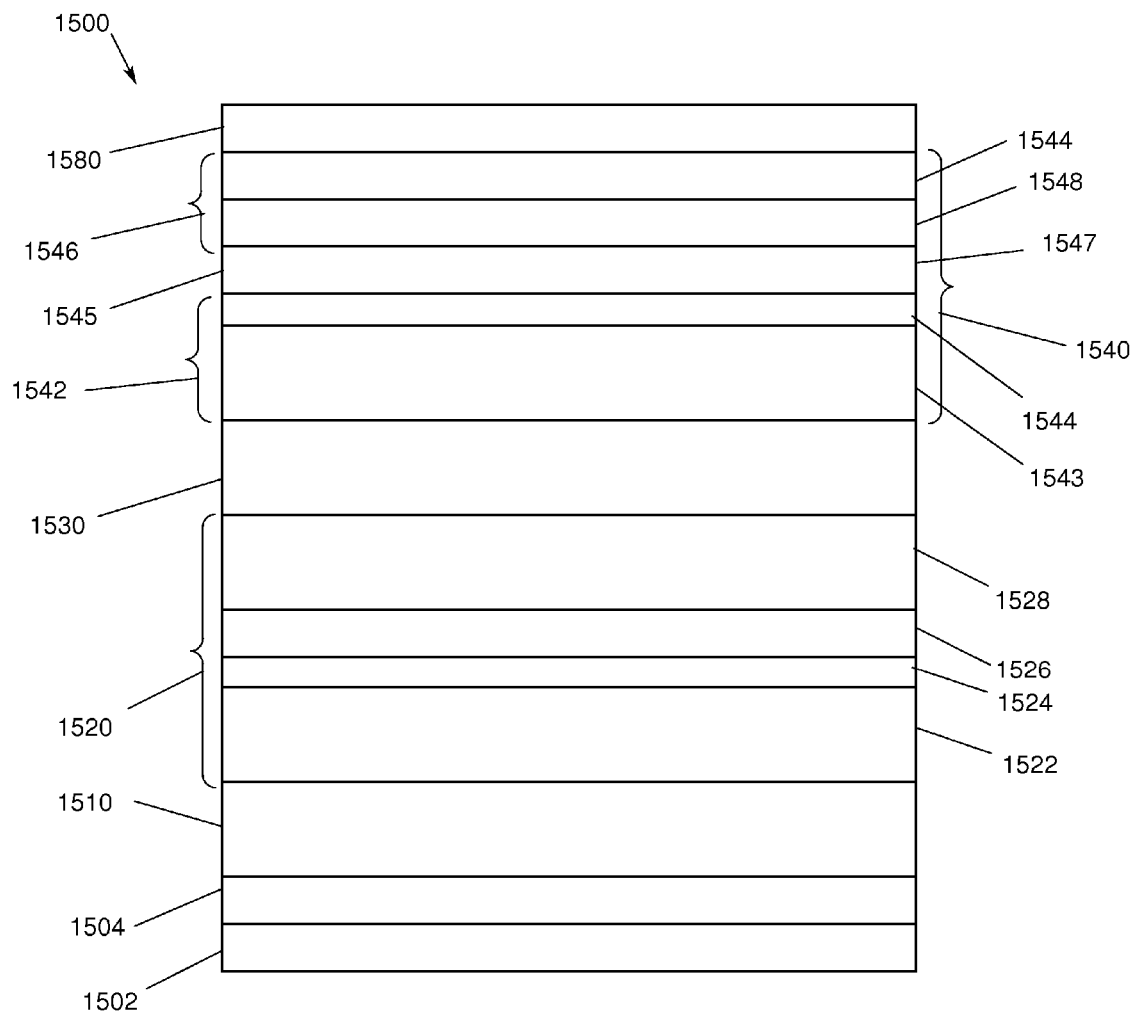
FIG. 15 illustrates a CPP GMR sensor that uses an IrMnCr pinning layer to provide a zero net moment in the pinned layer and a thin Ru layer according to another embodiment of the present invention.

FIG. 15 illustrates a CPP GMR sensor 1500 that uses an IrMnCr pinning layer to provide a zero net moment in the pinned layer and a thin Ru layer according to another embodiment of the present invention. In a CPP sensor as shown in FIG. 15, the sense current flows from the top of the sensor to the bottom of the sensor perpendicular to the plane of the layers of material making up the sensor.

In FIG. 15, a thin pinning layer of iridium manganese chromium (IrMnCr) 1510 is used as the antiferromagnetic material to provide a zero net moment pinned layer. A pinned layer 1520 is formed over the IrMnCr pinning layer 1510. The pinned layer 1520 includes a first layer of $Co_{75}Fe_{25}$ 1522, an interlayer 1524, such as ruthenium, and a second layer of $Co_{75}Fe_{25}$ 1526. A third layer 1528 is formed on the second layer of $Co_{75}Fe_{25}$ 1526. The third layer 1528 uses a $Co_2XY$ layer, where X is a material chosen from a group that includes manganese, iron and chromium, and Y is a material chosen from a group that includes silicon, germanium and aluminum. In a CPP GMR sensor, a copper spacer layer 1530 is provided on the third layer 1528. A synthetic antiparallel free layer 1540 is formed on the spacer layer 1530. The synthetic antiparallel free layer 1540 includes a first free layer 1542 having a first layer of $Co_2XY$ 1543 and a second layer of CoFe 1544. An interlayer 1545, e.g., ruthenium, is formed on the CoFe layer 1544. A second free layer 1546, oriented 180° from the first free layer 1542, is formed on the interlayer 1545. The second free layer 1546 includes a third free layer 1547 of CoFe 1548 and a fourth layer of NiFe 1549. A cap layer 1580 is formed over the NiFe layer 1549.

High spin polarization of the ferromagnetic materials adjacent the nonmagnetic spacer layer 1530 is essential for high magnetoresistance. However, Co, Fe and Ni alloys have only relatively low spin-polarization. In contrast, certain half-metallic ferromagnetic Heusler alloys, e.g., $Co_2XY$ as defined above, exhibit near 100% spin polarization and thus are candidates for providing high spin polarization of the ferromagnetic materials adjacent the nonmagnetic spacer layer 1530 for high magnetoresistance.

Figure 16:
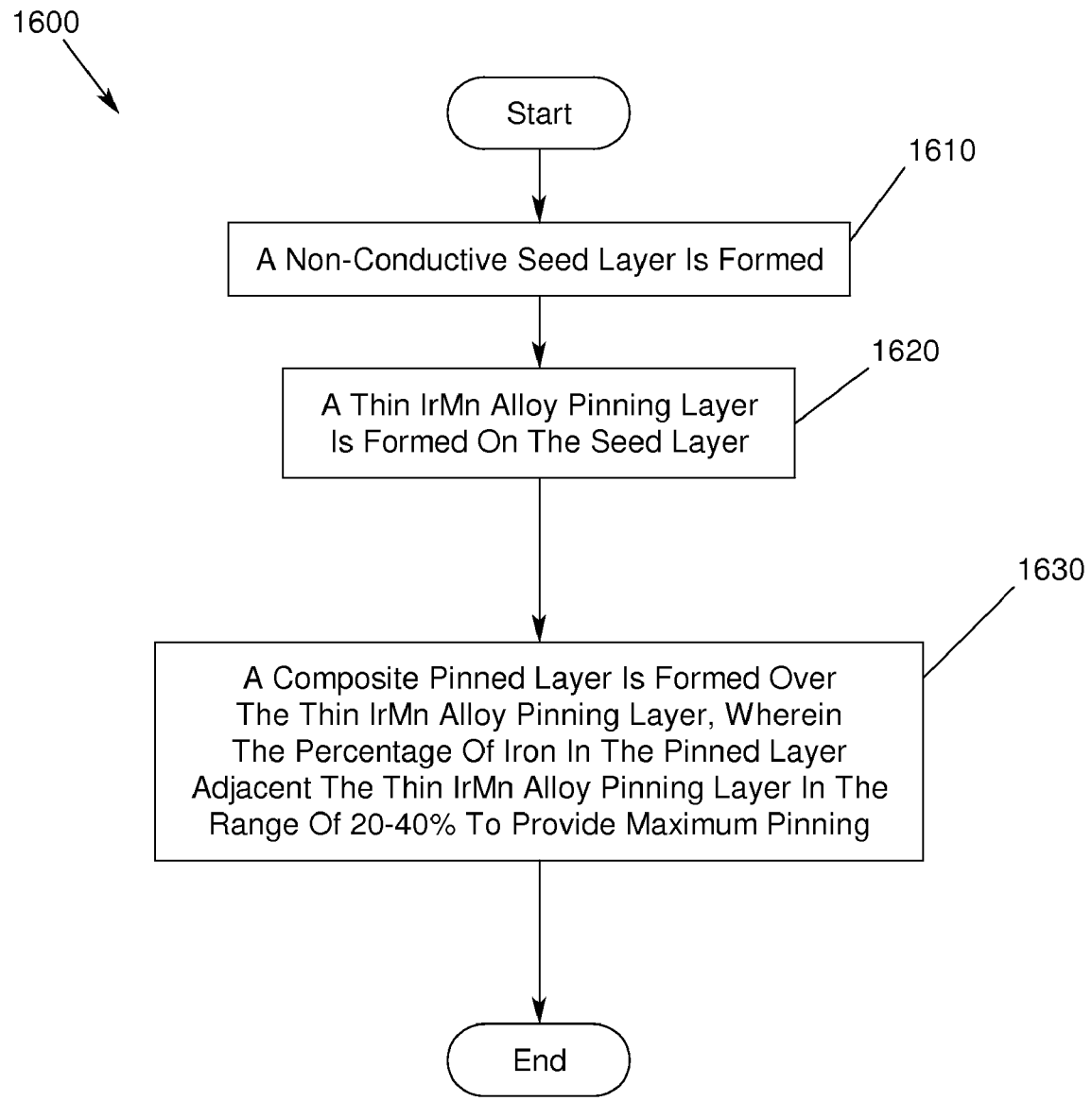
FIG. 16 is a flow chart of the method for providing a magnetic read sensor having a thin pinning layer and improved magnetoresistive coefficient $\Delta R/R$.

FIG. 16 is a flow chart 1600 of the method for providing a magnetic read sensor having a thin pinning layer and improved magnetoresistive coefficient $\Delta R/R$. In FIG. 16, a non-conductive seed layer is formed 1610. A thin IrMn alloy pinning layer is formed on the seed layer 1620. A composite pinned layer is formed over the thin IrMn alloy pinning layer, wherein the percentage of iron in the pinned layer adjacent the thin IrMn alloy pinning layer in the range of 20-40% to provide maximum pinning 1630.

While the write portions of the magnetic sensors illustrated herein have been shown as longitudinal magnetic recording write heads, the goal of providing higher areal densities for increased storage capacity requires the bit sizes to be decreased thereby leading to the transition to perpendicular write heads. Longitudinal magnetic recording involves aligning each data bit horizontally in relation to the drive's spinning platter. In perpendicular recording, each bit is aligned vertically—or perpendicularly—in relation to the disk drive's platter. Since the bits do not directly oppose each other, the need for transition packing is significantly reduced. This allows bits to be more closely packed with sharper transition signals, facilitating easier bit detection and error correction. The potential for higher areal density results. Accordingly, a person skilled in the art will readily recognize the embodiments of the present invention are applicable to either longitudinal recording heads or perpendicular recording heads.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A magnetic read head, comprising:
   a ferromagnetic pinned layer structure comprising at least two pinned layers, the ferromagnetic pinned structure having a high positive magnetostriction;
   an iridium manganese (IrMn) alloy pinning layer, exchange coupled to the pinned layer structure, for pinning the magnetic moment of the pinned layer structure;
   a free layer structure having a first magnetization that is free to rotate; and
   a spacer layer disposed between the free layer structure and the ferromagnetic pinned layer structure;
   wherein the at least two pinned layers of the ferromagnetic pinned layer structure provide maximum exchange coupling between the pinned layer structure and the iridium manganese alloy pinning layer and wherein thickness of at least two of the pinned layers are equal.

2. The magnetic read head of claim 1, wherein the spacer layer is a manganese oxide layer.

3. The magnetic read head of claim 1, wherein the pinned layer comprises a cobalt iron layer, an interlayer and a cobalt iron boron layer, wherein the cobalt iron layer is formed on the pinning layer.

4. The magnetic read head of claim 1, wherein the free layer structure comprises a cobalt iron layer and a cobalt iron boron layer, wherein the cobalt iron layer is formed on the spacer layer.

5. The magnetic read head of claim 4 further comprising a tantalum layer formed on the cobalt iron boron layer and a nickel iron layer formed on the tantalum layer.

6. The magnetic read head of claim 1, wherein the spacer layer further comprising a copper spacer layer for providing a conductive spacer layer between the free layer and the pinned layer.

7. The magnetic read head of claim 6, wherein the pinned layer further comprises a third layer, the third layer comprising a $Co_2XY$ layer, where X is a material chosen from a group that includes manganese, iron and chromium, and Y is a material chosen from a group that includes silicon, germanium and aluminum.

8. The magnetic read head of claim 7, wherein the free layer structure comprises a synthetic free layer comprising a first and second free layer separated by an interlayer, the first and second free layer having antiparallel magnetic orientations.

9. The magnetic read head of claim 8, wherein the first free layer comprises a layer comprising a cobalt iron free layer and a $Co_2XY$ layer formed on the copper spacer layer between the cobalt iron free layer and the copper spacer layer, where X is a material chosen from a group that includes manganese, iron and chromium, and Y is a material chosen from a group that includes silicon, germanium and aluminum.

10. The magnetic read head of claim 8, wherein the second free layer comprises a cobalt iron free layer formed on the interlayer and a nickel iron layer formed on the cobalt iron free layer.

11. A magnetic storage device, comprising:
    a magnetic media for storing data thereon;
    a motor, coupled to the magnetic media, for translating the magnetic media;
    a transducer for reading and writing data on the magnetic media; and
    an actuator, coupled to the transducer, for moving the transducer relative to the magnetic media;
    wherein the transducer includes a read sensor comprising:
      a ferromagnetic pinned layer structure comprising at least two pinned layers, the ferromagnetic pinned structure having a high positive magnetostriction;
      an iridium manganese (IrMn) alloy pinning layer, exchange coupled to the pinned layer structure, for pinning the magnetic moment of the pinned layer structure;
      a free layer structure having a first magnetization that is free to rotate; and
      a spacer layer disposed between the free layer structure and the ferromagnetic pinned layer structure;
      wherein the at least two pinned layers of the ferromagnetic pinned layer structure provide maximum exchange coupling between the pinned layer structure and the iridium manganese alloy pinning layer and wherein thickness of at least two of the pinned layers are equal.

12. The magnetic read head of claim 11, wherein the spacer layer is a manganese oxide layer.

13. The magnetic read head of claim 11, wherein the pinned layer comprises a cobalt iron layer, an interlayer and a cobalt iron boron layer, wherein the cobalt iron layer is formed on the pinning layer and wherein the free layer structure comprises a cobalt iron layer and a cobalt iron boron layer, wherein the cobalt iron layer is formed on the spacer layer.

14. The magnetic read head of claim 13 further comprising a tantalum layer formed on the cobalt iron boron layer and a nickel iron layer formed on the tantalum layer.

15. The magnetic read head of claim 11, wherein the spacer layer further comprising a copper spacer layer for providing a conductive spacer layer between the free layer and the pinned layer.

16. The magnetic read head of claim 15, wherein the pinned layer further comprises a third layer, the third layer comprising a $Co_2XY$ layer, where X is a material chosen from a group that includes manganese, iron and chromium, and Y is a material chosen from a group that includes silicon, germanium and aluminum.

17. The magnetic read head of claim 16, wherein the free layer structure comprises a synthetic free layer comprising a first and second free layer separated by an interlayer, the first and second free layer having antiparallel magnetic orientations.

18. The magnetic read head of claim 17, wherein the first free layer comprises a layer comprising a cobalt iron free layer and a $Co_2XY$ layer formed on the copper spacer layer between the cobalt iron free layer and the copper spacer layer, where X is a material chosen from a group that includes manganese, iron and chromium, and Y is a material chosen from a group that includes silicon, germanium and aluminum.

19. The magnetic read head of claim 17, wherein the second free layer comprises a cobalt iron free layer formed on the interlayer and a nickel iron layer formed on the cobalt iron free layer.

20. A method for providing a magnetic read sensor having a thin pinning layer and improved magnetoresistive coefficient, comprising:
    forming a ferromagnetic pinned layer structure comprising at least two pinned layers, the ferromagnetic pinned structure having a high positive magnetostriction;
    forming an iridium manganese (IrMn) alloy pinning layer, exchange coupled to the pinned layer structure, for pinning the magnetic moment of the pinned layer structure;
    forming a free layer structure having a first magnetization that is free to rotate; and
    forming a spacer layer disposed between the free layer structure and the ferromagnetic pinned layer structure;
    wherein the at least two pinned layers of the ferromagnetic pinned layer structure provide maximum exchange coupling between the pinned layer structure and the iridium manganese alloy pinning layer and wherein thickness of at least two of the pinned layers are equal.

* * * * *